(12) United States Patent  (10) Patent No.: US 8,525,225 B2
Kambayashi et al.  (45) Date of Patent: Sep. 3, 2013

(54) SEMICONDUCTOR DEVICE

(75) Inventors: Hiroshi Kambayashi, Tokyo (JP);
Nariaki Ikeda, Tokyo (JP); Seikoh Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/511,293

(22) Filed: Aug. 29, 2006

(65) Prior Publication Data

US 2007/0051979 A1  Mar. 8, 2007

(30) Foreign Application Priority Data

Sep. 2, 2005 (JP) ................................. 2005-255603

(51) Int. Cl.
*H01L 29/739* (2006.01)
(52) U.S. Cl.
USPC ..... 257/192; 257/183; 257/194; 257/E29.246
(58) Field of Classification Search
USPC ............ 257/183, 10, 194, E29.246, E29.253, 257/183.1, 17, 189; 372/46.01, 43.01, 44.01; 358/248, 256; 359/279
See application file for complete search history.

(56) References Cited

U.S. PATENT DOCUMENTS

| | | | | |
|---|---|---|---|---|
| 6,387,721 B1* | 5/2002 | Hashimoto et al. | ............ | 438/46 |
| RE38,072 E * | 4/2003 | Kondo et al. | .................. | 438/47 |
| 6,873,018 B2* | 3/2005 | Bhattacharyya | ............. | 257/378 |
| 7,068,696 B2* | 6/2006 | Ezaki et al. | ................ | 372/46.01 |
| 7,132,747 B2* | 11/2006 | Kwon et al. | .................. | 257/724 |
| 7,365,416 B2* | 4/2008 | Kawabata et al. | ........... | 257/686 |
| 7,525,122 B2* | 4/2009 | Ring et al. | ....................... | 257/76 |
| 2004/0013148 A1* | 1/2004 | Kwak et al. | ...................... | 372/46 |
| 2004/0144991 A1* | 7/2004 | Kikkawa | ....................... | 257/103 |
| 2004/0251521 A1* | 12/2004 | Tanaka et al. | ................. | 257/639 |
| 2005/0152419 A1* | 7/2005 | Kishimoto et al. | ............. | 372/43 |
| 2005/0280160 A1* | 12/2005 | Kim et al. | ....................... | 257/777 |
| 2006/0006475 A1* | 1/2006 | Chaudhry | ....................... | 257/370 |
| 2006/0102929 A1* | 5/2006 | Okamoto et al. | ............. | 257/189 |
| 2006/0119592 A1* | 6/2006 | Wang et al. | .................... | 345/204 |
| 2006/0120424 A1* | 6/2006 | Tanaka | ....................... | 372/43.01 |
| 2006/0121714 A1* | 6/2006 | Ohta et al. | ..................... | 438/595 |
| 2006/0220063 A1* | 10/2006 | Kurachi et al. | ............... | 257/194 |

(Continued)

FOREIGN PATENT DOCUMENTS

JP  10-074776  3/1998
JP  2003-179082  6/2003

(Continued)

OTHER PUBLICATIONS

Office Action issued Mar. 1, 2011, in Japanese Application No. 2005-255603 (with English-language Translation), Filed Sep. 2, 2005.

*Primary Examiner* — Cheung Lee
*Assistant Examiner* — William Harriston
(74) *Attorney, Agent, or Firm* — Oblon, Spivak, McClelland, Maier & Neustadt, L.L.P.

(57) ABSTRACT

A semiconductor device includes a plurality of electrodes arranged on a compound semiconductor layer grown on a substrate, and a surface protection film that protects a surface of a semiconductor layer on the compound semiconductor layer between the electrodes. A refractive index of the surface protection film is controlled so that a stress caused by the surface protection film on the surface of the semiconductor layer is minimized.

7 Claims, 5 Drawing Sheets

(56) References Cited

U.S. PATENT DOCUMENTS

| | | | |
|---|---|---|---|
| 2006/0231852 A1* | 10/2006 | Kususe et al. | 257/99 |
| 2007/0158683 A1* | 7/2007 | Sheppard et al. | 257/183 |
| 2007/0181895 A1* | 8/2007 | Nagai | 257/98 |
| 2008/0290371 A1* | 11/2008 | Sheppard et al. | 257/192 |
| 2008/0290372 A1* | 11/2008 | Makiyama | 257/194 |
| 2009/0001422 A1* | 1/2009 | Okayasu et al. | 257/192 |
| 2009/0029507 A1* | 1/2009 | Goto et al. | 438/151 |
| 2010/0308373 A1* | 12/2010 | Nagahisa et al. | 257/192 |
| 2011/0140123 A1* | 6/2011 | Sheppard et al. | 257/76 |
| 2011/0316048 A1* | 12/2011 | Ikeda et al. | 257/192 |
| 2012/0032188 A1* | 2/2012 | Kanamura et al. | 257/76 |
| 2012/0235160 A1* | 9/2012 | Heikman et al. | 257/76 |

FOREIGN PATENT DOCUMENTS

| | | |
|---|---|---|
| JP | 2003-324111 | 11/2003 |
| JP | 2004-214471 | 7/2004 |
| JP | 2004-221325 | 8/2004 |
| JP | 2005-129856 | 5/2005 |
| JP | 2006-278812 | 10/2006 |
| WO | 2005/076365 | 8/2005 |

\* cited by examiner

SEMICONDUCTOR DEVICE

BACKGROUND OF THE INVENTION

1. Field of the Invention

The present invention relates to a technology for forming a surface protection film on a semiconductor device.

2. Description of the Related Art

A semiconductor device manufactured from a compound semiconductor can be effectively used as a high voltage-resistant device or a high-speed device due to an essential nature of compound semiconductor materials, such as a direct transition. Recently, a high electron mobility transistor (HEMT), which is one of the field effect transistors (FETs) manufactured from a nitride-based compound semiconductor, has been popular and various types of HEMTs are developed (see, for example, Japanese Patent Application Laid-Open No. 2005-129856 and Japanese Patent Application Laid-Open No. 2003-179082).

FIG. 8 is a cross section of a conventional HEMT of a gallium-nitride (GaN)-based compound semiconductor. In the HEMT shown in FIG. 8, a buffer layer 12 of GaN, a channel layer 13 of undoped-GaN, and an electron supply layer 14 of aluminum gallium nitride (AlGaN) that is thinner than the undoped-GaN are grown on a semi-insulating substrate 11 such as a sapphire substrate to form a heterojunction structure. A source electrode S, a gate electrode G, and a drain electrode D are arranged on the electron supply layer 14. A contact layer of n-type gallium nitride (n-GaN) (not shown) is formed between the source electrode S, the drain electrode D, and the electron supply layer 14 for reducing a contact resistance between the layers.

In the HEMT, two-dimensional electron gas generated right under a heterojunction between the channel layer 13 and the electron supply layer 14 is generally used as a career. In FIG. 8, a middle layer 16 of the nitride-based compound semiconductor with bandgap energy larger than that of the channel layer 13 is grown between the channel layer 13 and the electron supply layer 14. Further, a two-dimensional electron gas layer 15 with higher density than usual is formed between the channel layer 13 and the electron supply layer 14. As a result, a low-loss high-output FET is realized.

In the HEMT, when a voltage is applied between the source electrode S and the drain electrode D, electrons provided in the channel layer 13 travel through the two-dimensional electron gas layer 15 at high speed toward the drain electrode D. The electrons that move from the source electrode S to the drain electrode D, that is, a drain current can be controlled by changing a thickness of a depletion layer right under the gate electrode G based on a voltage applied to the gate electrode G.

In the HEMT of GaN, it is known that a large electric charge is generated in the channel layer due to a piezoelectric effect, while negative electric charge is generated on the surface of a semiconductor of such as AlGaN. The negative electric charge acts directly on the drain current and greatly affects to a performance of the HEMT. Specifically, when the large negative electric charge is generated on the surface, a current collapse occurs, which degrades a maximum drain current of an alternating current compared with that of a direct current. In order to prevent an occurrence of the current collapse, a surface protection film of silicon nitride ($SiN_x$) has been formed on the surface of the electron supply layer 14.

However, when $SiN_x$ is used for the surface protection film for the FET such as the HEMT, there still is a problem that a larger gate leakage current is generated compared with using other type of surface protection film of, for example, silicon dioxide ($SiO_2$). Further, when $SiN_x$ is used for a surface protection film for a diode, there is a problem that Schottky leakage current is generated, which is one of the leakage currents generated at a Schottky electrode. Moreover, when $SiN_x$ is used for the surface protection film for the diode or the semiconductor devices such as the FET, because a withstanding voltage of $SiN_x$ is low, there is a problem that the withstanding voltage of the semiconductor device degrades.

SUMMARY OF THE INVENTION

It is an object of the present invention to at least partially solve the problems in the conventional technology.

A semiconductor device according to one aspect of the present invention includes a plurality of electrodes arranged on a compound semiconductor layer grown on a substrate; and a surface protection film that protects a surface of a semiconductor layer on the compound semiconductor layer between the electrodes. A refractive index of the surface protection film is controlled so that a stress caused by the surface protection film on the surface of the semiconductor layer is minimized.

A semiconductor device according to another aspect of the present invention includes a plurality of electrodes arranged on a compound semiconductor layer grown on a substrate; and a surface protection film that protects a surface of a semiconductor layer on the compound semiconductor layer between the electrodes. The surface protection film is a dielectric film of silicon nitride. A refractive index of the surface protection film is equal to or greater than 2.0.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained below in detail with reference to the accompanying drawings. The present invention is not limited to the embodiments explained below.

Figure 1:
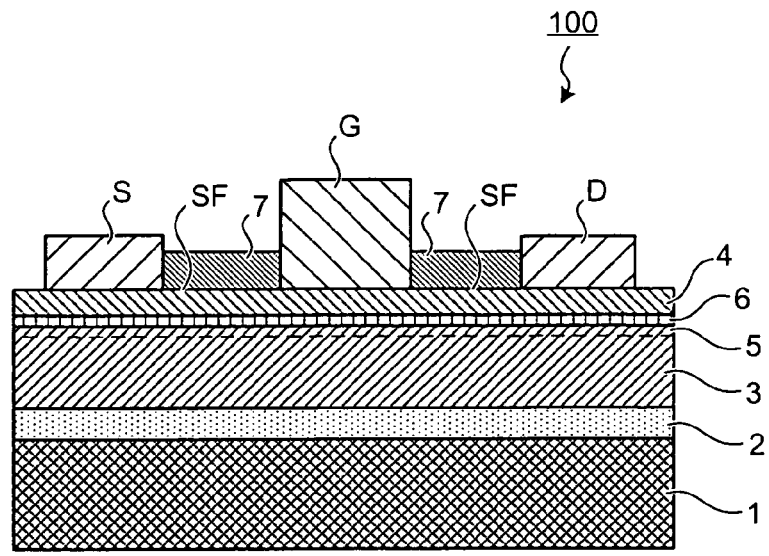
FIG. 1 is a cross section of a semiconductor device according to a first embodiment of the present invention.

FIG. 1 is a cross section of a HEMT 100 as an example of a semiconductor device according to a first embodiment of the present invention. The HEMT 100 is configured with a heterojunction structure in which a buffer layer 2 of GaN, a channel layer 3 of GaN, a middle layer 6 of undoped-aluminum nitride (AlN), and an electron supply layer 4 of undoped-$Al_{0.25}Ga_{0.75}N$ that is thinner than the channel layer 3 are sequentially grown on a semi-insulating substrate 1 such as a sapphire substrate. A source electrode S, a gate electrode G, and a drain electrode D are arranged on the electron supply layer 4. A surface protection film 7 is also arranged between the source electrode S, the gate electrode G, and the drain electrode D on the electron supply layer 4 for protecting a surface SF that is a surface of a semiconductor layer on the compound semiconductor layer.

The electron supply layer 4 has larger bandgap energy than that of the channel layer 3 and a two-dimensional electron gas layer 5 is formed right under a heterojunction between the electron supply layer 4 and the channel layer 3. Specifically, in the HEMT 100, the middle layer 6 with larger bandgap energy than that of the channel layer 3 is grown between the channel layer 3 and the electron supply layer 4, and further, the two-dimensional electron gas layer 5 with higher density is formed between the channel layer 3 and the electron supply layer 4. The two-dimensional electron gas layer 5 is formed based on a piezoelectric field generated due to a piezoelectric effect caused by a crystal distortion at the heterojunction.

In the HEMT 100, when a voltage is applied between the source electrode S and the drain electrode D, electrons provided in the channel layer 3 travel through the two-dimensional electron gas layer 5 at high speed toward the drain electrode D. The electrons that move from the source electrode S to the drain electrode D, which is a drain current, can be controlled by changing a thickness of a depletion layer right under the gate electrode G based on a voltage applied to the gate electrode G.

The surface protection film 7 of a dielectric film of $SiN_x$ is formed in the HEMT 100 to prevent an occurrence of a current collapse and to reduce a gate leakage current. Upon forming the surface protection film 7, the applicant has focused on a stress caused by the surface protection film 7 on the surface SF. It is assumed that, in a conventional surface protection film of $SiN_x$, a piezo-charge is generated at an end portion of the gate electrode due to the stress caused by the surface protection film, and the gate leakage current is generated due to the piezo-charge. Therefore, a relation between the stress and the gate leakage current is examined.

Figure 2:
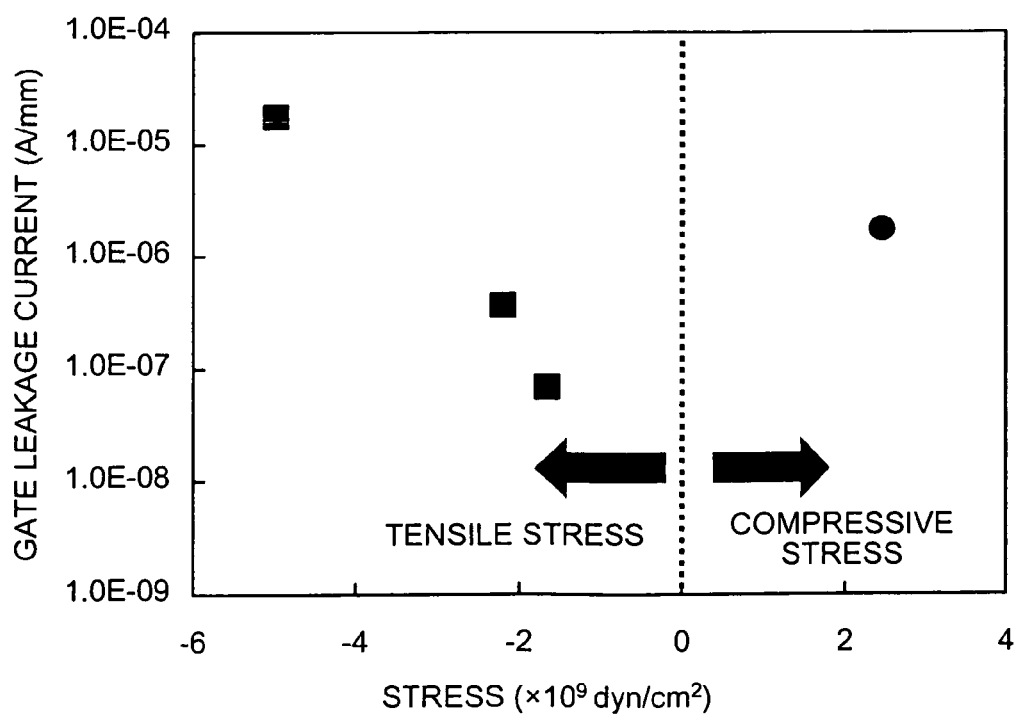
FIG. 2 is a graph of a relation between a stress caused by a surface protection film on a surface of a semiconductor layer and a gate leakage current.

FIG. 2 is a graph of a relation between the stress and the gate leakage current, obtained from an actual measurement of samples of the surface protection film 7 having different stresses. A result of measuring a surface protection film of $SiN_x$ (hereinafter, "$SiN_x$ surface protection film") is indicated by "|". On the other hand, a result of measuring a surface protection film of silicon dioxide ($SiO_2$) (hereinafter, "$SiO_2$ surface protection film") is indicated by "●". According to FIG. 2, a voltage of −5 V is applied to the gate electrode G. A tensile stress is indicated with a negative value, and a compressive stress is indicated with a positive value in FIG. 2.

According to FIG. 2, it is found that the gate leakage current can be reduced by reducing the stress of the $SiN_x$ surface protection film. It is also found that, when the stress of the $SiN_x$ surface protection film and a stress of the $SiO_2$ surface protection film is the same, the $SiN_x$ surface protection film is more effective to reduce the gate leakage current than the $SiO_2$ surface protection film does.

Figure 3:
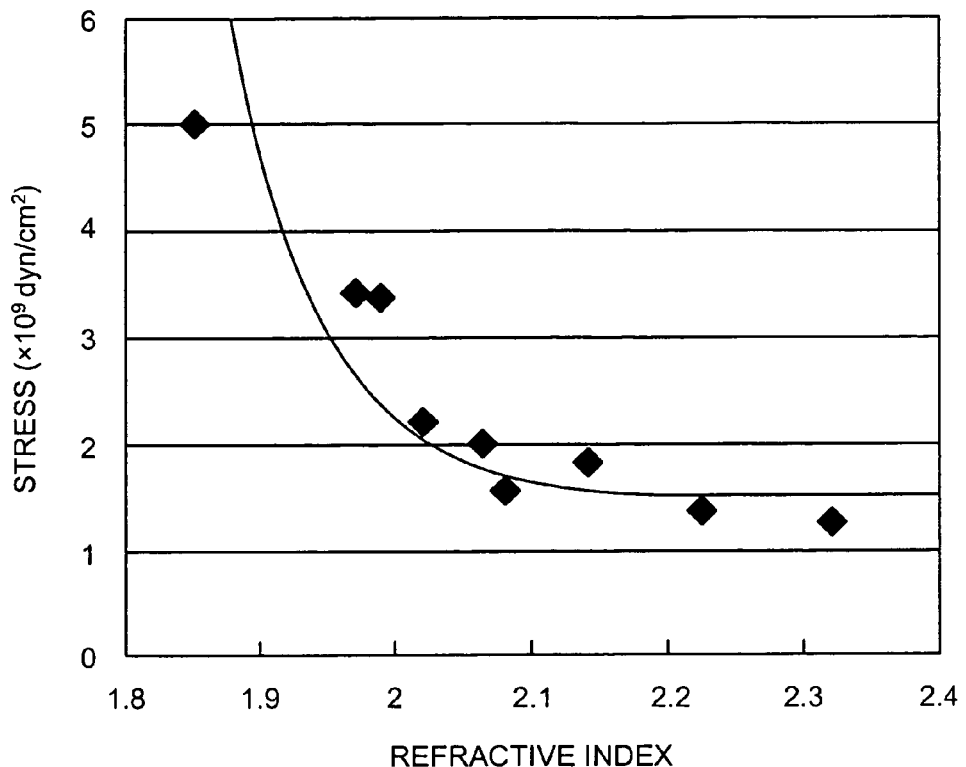
FIG. 3 is a graph of a relation between a refractive index of the surface protection film and the stress caused by the surface protection film on the surface of the semiconductor layer.

Next, a relation between a refractive index of the $SiN_x$ surface protection film and the stress of the $SiN_x$ surface protection film is examined for determining a condition for depositing the surface protection film 7 with a refractive index that causes a minimal stress on the surface SF. FIG. 3 is a graph of a relation between the refractive index and the stress, obtained from an actual measurement of samples of the surface protection film 7 having different refractive indices. In FIG. 3, the stress indicates the tensile stress applied to the surface SF. According to FIG. 3, it is found that the stress of the $SiN_x$ surface protection film is reduced with an increase of the refractive index, and when the refractive index becomes greater than 2.0, the stress is minimized.

Figure 4:
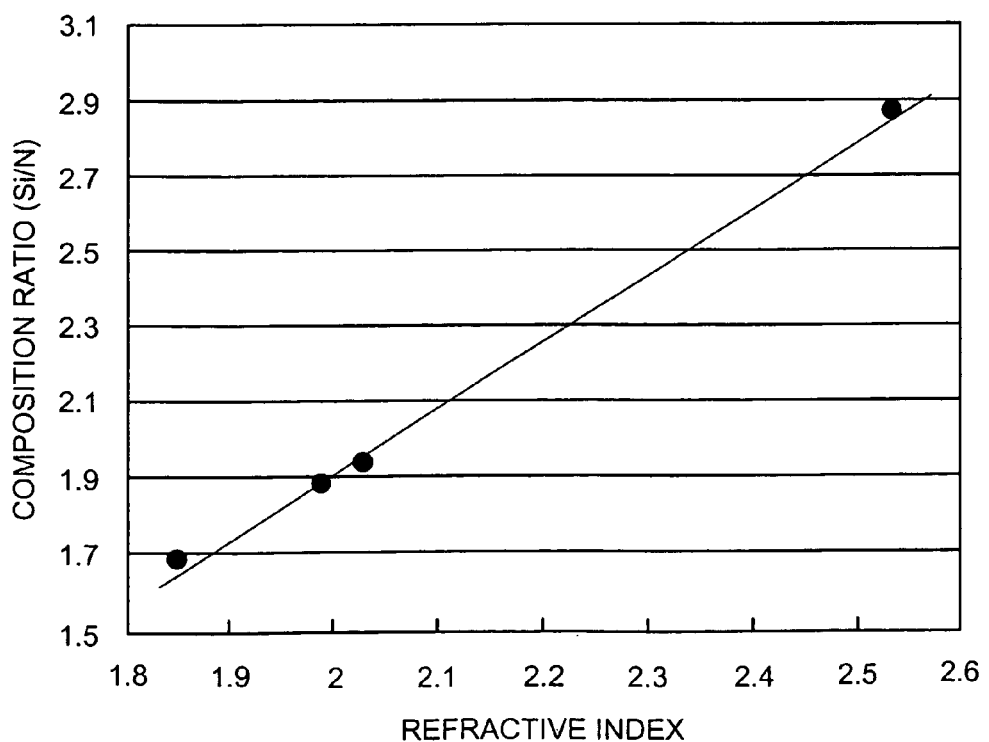
FIG. 4 is a graph of a relation between the refractive index and a composition ratio of silicon (Si) and nitride (N)

Next, a relation between a composition ratio between Si and N (hereinafter, "Si/N ratio") of $SiN_x$ and the refractive index is examined for determining a condition for composing $SiN_x$ so that the refractive index of the $SiN_x$ surface protection film becomes equal to or greater than 2.0. FIG. 4 is a graph of the relation between the refractive index and the Si/N ratio, obtained from an actual measurement of samples of the surface protection film 7 having different refractive indices. According to FIG. 4, the refractive index is linearly proportional to the Si/N ratio. Therefore, the refractive index can be determined by controlling the Si/N ratio. More specifically, when the value of the Si/N ratio ranges between 1.85 and 2.9, that is, a value x for $SiN_x$ ranges between 0.34 and 0.55 ($0.34 \leq x \leq 0.55$), the refractive index of the $SiN_x$ surface protection film ranges between 2.0 and 2.5.

As described above, the surface protection film 7 is formed to have the refractive index that causes a minimal stress on the surface SF. Namely, the refractive index of the surface protection film 7 is determined as equal to or greater than 2.0. Further, the refractive index is determined as smaller than or equal to 2.2 considering a withstand voltage. The surface protection film 7 is a dielectric film of $SiN_x$, and the refractive index of the surface protection film 7 is determined based on the Si/N ratio, which is in a range between 0.34 and 0.55.

According to the first embodiment, the HEMT 100 includes the surface protection film 7 of the dielectric film of $SiN_x$ that can reduce the gate leakage current, thereby high reliability in the semiconductor device can be realized. Further, because the surface protection film 7 in the HEMT 100 is of $SiN_x$, an occurrence of the current collapse can still be prevented as with a surface protection film of $SiN_x$ using a conventional technique.

The HEMT 100 is manufactured by growing a nitride-based compound semiconductor layer on the semi-insulating substrate 1 with the metal organic chemical vapor deposition (MOCVD) method. Specifically, the semi-insulating substrate 1 such as the sapphire substrate is firstly arranged in an MOCVD chamber with a vacuum of 100 hPa. Thereafter, trimethyl gallium (TMGa) with a feed rate of 130 cm³/min and ammonia ($NH_3$) with a feed rate of 12 l/min, which are used as materials for forming the compound semiconductor, are injected into the MOCVD device. Further, at a growth temperature of 1100° C., the buffer layer 2 of GaN with a thickness of 50 nm is formed on the semi-insulating substrate 1.

Next, TMGa with the feed rate of 100 cm³/min and $NH_3$ with the feed rate of 12 l/min are injected. At a growth temperature of 1050° C., the channel layer 3 of GaN with a thickness of 400 nm is formed on the buffer layer 2. Thereafter, trimethyl aluminum (TMAl) and $NH_3$ are injected with respective feed rate of 50 cm³/min and 12 l/min. At the growth temperature of 1050° C., the middle layer 6 of AlN with a thickness of 1 nm and is formed on the channel layer 3. Further, TMAl, TMGa, and $NH_3$ are injected with respective feed rate of 50 cm³/min, 100 cm³/min, and 12 l/min. At the growth temperature of 1050° C., the electron supply layer 4 of $Al_{0.25}Ga_{0.75}N$ with a thickness of 30 nm is formed on the middle layer 6. A career density of the electron supply layer 4 is $1 \times 10^{16}/cm^3$.

Next, with a patterning using photo lithography, a mask of a $SiO_2$ film is formed in a region for forming the gate electrode G on the surface of the electron supply layer 4. Further, an opening portion corresponding to each shape of the each electrode is formed in regions for forming the source electrode S and the drain electrode D on the surface of the electron supply layer 4. Thereafter, titanium (Ti), aluminum (Al), and gold (Au) are sequentially deposited with thicknesses of 50 nm, 50 nm, and 100 nm, respectively. Thereby, the source electrode S and the drain electrode D are formed. Next, the mask is removed from the electron supply layer 4 and $SiN_x$ is deposited between the source electrode S and the drain electrode D on the surface of the electron supply layer 4 to form the surface protection film 7 with a refractive index of, for example, 2.02. In this case, it is preferable that the thickness of the surface protection film 7 is equal to or smaller than 150 nm. The opening portion corresponding to the shape of the gate electrode G is formed by etching the surface protection film 7 in a region of the surface, in which the gate electrode G is formed.

Figure 5:
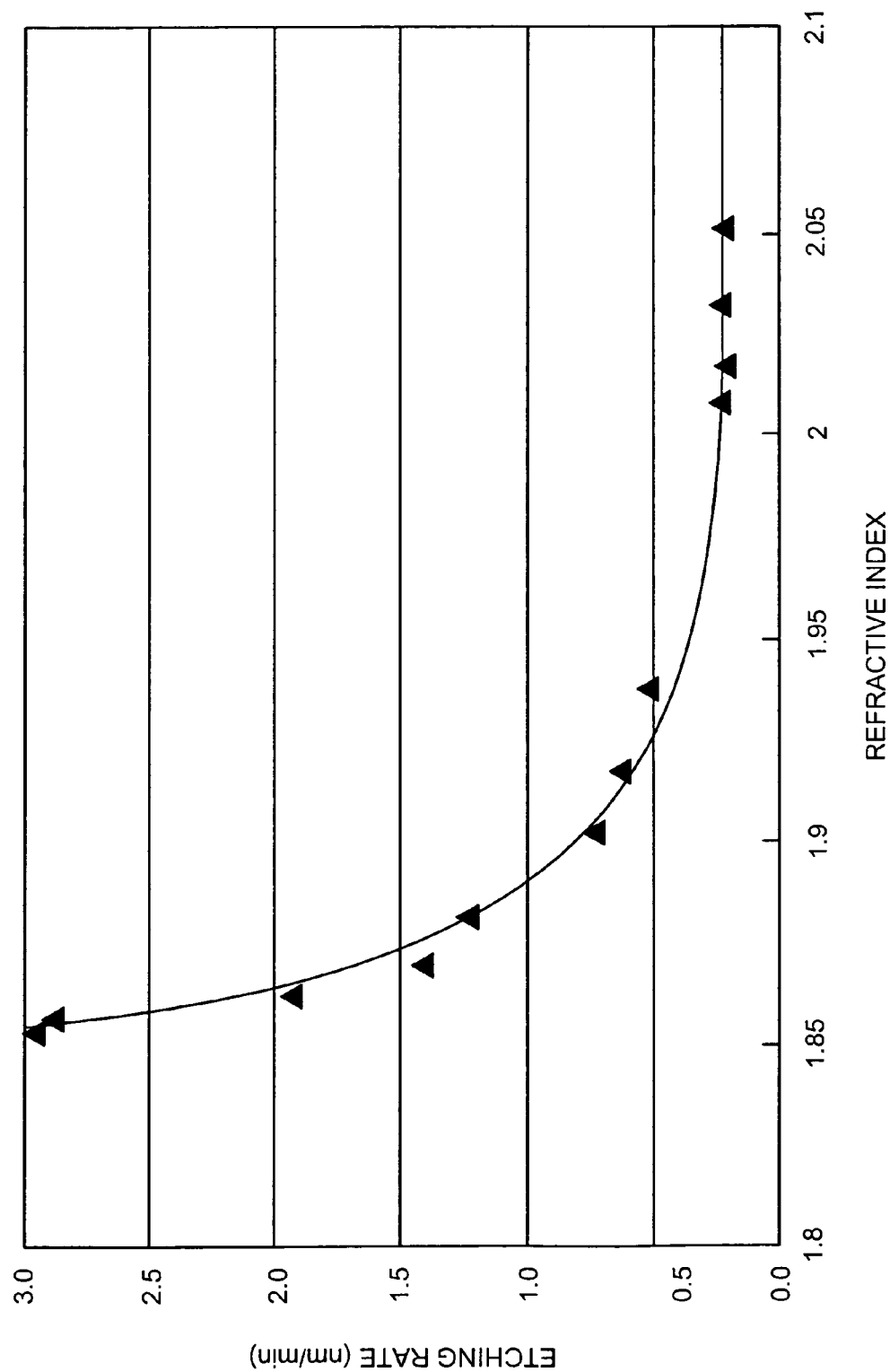
FIG. 5 is a graph of a relation between the refractive index of the surface protection layer and an etching rate.
Figure 8:
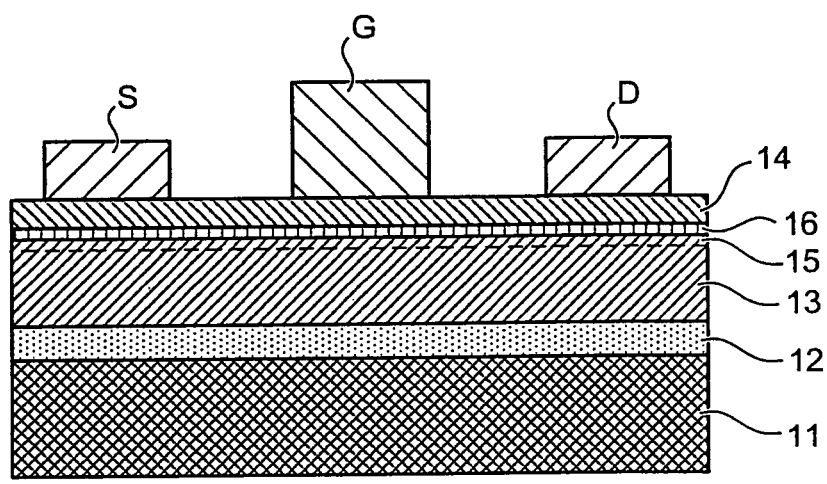
FIG. 8 is a cross section of a conventional semiconductor device.

The surface protection film 7 is effective to stabilize an etching rate compared with using a conventional surface protection film, when etching the opening portion for forming the gate electrode G. FIG. 5 is a graph of a relation between the refractive index of the surface protection film and the etching rate, obtained from an actual measurement of samples of the surface protection film 7 having different refractive indices. The measurement is conducted using buffered hydrofluoric acid (BHF) containing 7.1% to 7.4% of hydrofluoric acid (HF) and 33.6% to 34.2% of ammonia fluoride ($NH_4F$). According to FIG. 5, the etching rate of etching the surface protection film 7 decreases with an increase of the refractive index of the surface protection film 7. Therefore, when using the surface protection film 7 with the refractive index of equal to or greater than 2.0, the etching can be stably performed and it becomes easy to realize a good etching.

According to the first embodiment, the surface protection film 7 is formed between the source electrode S and the drain electrode D on the surface of the electron supply layer 4. Alternately, in a second embodiment, a voltage-resistant protection film is formed on the surface protection film 7 for improving a withstanding voltage.

Figure 6:
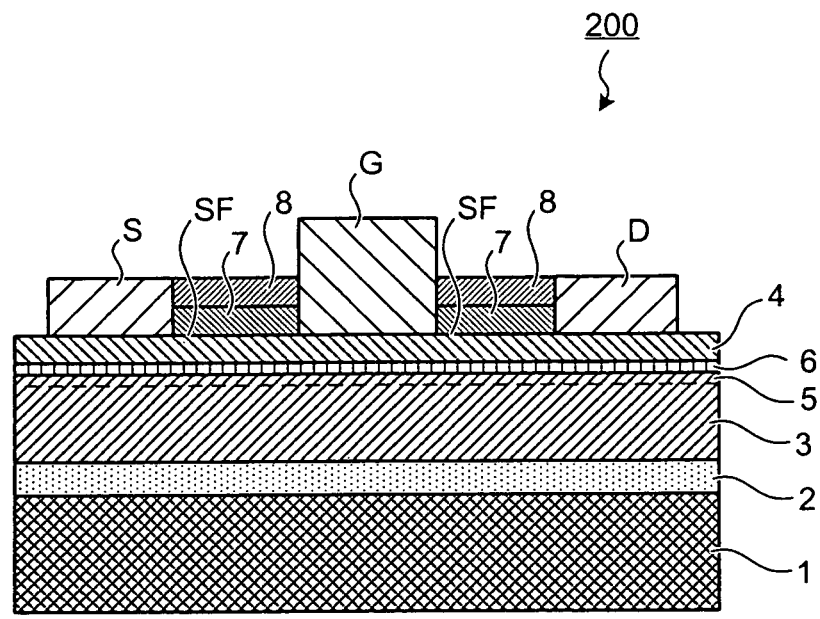
FIG. 6 is a cross section of a semiconductor device according to a second embodiment of the present invention.

FIG. 6 is a cross section of a HEMT 200 as an example of a semiconductor device according to a second embodiment of the present invention. The HEMT 200 is manufactured based on the structure of the HEMT 100 shown in FIG. 1, and a voltage-resistant protection film 8 is further formed on the surface protection film 7. Referring to FIG. 1, the same reference numbers denote the same components in FIG. 6.

The voltage-resistant protection film 8 is formed with a dielectric film such as $SiO_2$, aluminum oxide ($Al_2O_3$), or zirconium dioxide ($ZrO_2$) having a predetermined withstand voltage. More preferably, the voltage-resistant protection film 8 is formed with the dielectric film of $SiO_2$. With this structure, the dielectric film layer formed with the surface protection film 7 and the voltage-resistant protection film 8 in the HEMT 200 can prevent an occurrence of the current collapse as a whole layer. Compared with a conventional surface protection film, the dielectric film layer according to the second embodiment can further reduce the gate leakage current and further improve the withstanding voltage. Further, the HEMT 200 with the above dielectric film layer can realize high reliability of the semiconductor device.

Forming procedure for the surface protection film 7, the voltage-resistant protection film 8, and the gate electrode G according to the second embodiment are explained below. Similar to the forming procedure explained with the HEMT 100, the source electrode S and the drain electrode D are firstly formed, and thereafter, the mask on the electron supply layer 4 is removed. The surface protection film 7 of the dielectric film of $SiN_x$ with the refractive index of, for example, 2.02 is deposited between the source electrode S and the drain electrode D on the electron supply layer 4. Thereafter, the voltage-resistant protection film 8 of the dielectric film of $SiO_2$ with a permittivity of 4.0 is deposited on the surface protection film 7. The thickness of the surface protection film 7 is preferable to be smaller than or equal to 150 nm. The voltage-resistant protection film 8 and the surface protection film 7 formed on the surface, on which the gate electrode G is formed, are etched to form the opening portion corresponding to the gate electrode G. Lastly, Ni with a thickness of 100 nm and Au with a thickness of 200 nm are deposited on the opening portion to complete forming of the gate electrode G.

According to the second embodiment, the surface protection film 7 and the voltage-resistant protection film 8 are formed between the source electrode S and the drain electrode D on the electron supply layer 4. Alternately, in a third embodiment, a moisture-resistant protection film 9 is further formed on the voltage-resistant protection film 8 for improving a moisture resistance.

Figure 7:
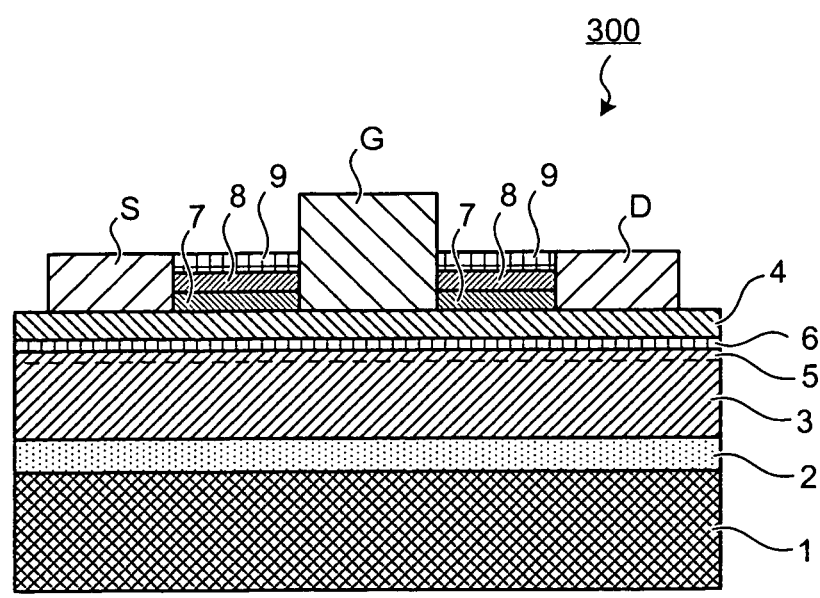
FIG. 7 is a cross section of a semiconductor device according to a third embodiment of the present invention.

FIG. 7 is a cross section of a HEMT 300 as a semiconductor device according to the third embodiment. The HEMT 300 is manufactured based on the structure of the HEMT 200 shown in FIG. 6, and the moisture-resistant protection film 9 is further formed on the voltage-resistant protection film 8. Referring to FIG. 6, the same reference numbers denote the same components in FIG. 7.

The moisture-resistant protection film 9 is of a dielectric film such as $SiN_x$ and has a predetermined moisture resistance. As a result, a dielectric film formed with the surface protection film 7, the voltage-resistant protection film 8, and the moisture-resistant protection film 9 in the HEMT 300 can prevent an occurrence of the current collapse as a whole. Compared with the conventional surface protection film, the surface protection film 7 according to the third embodiment can further reduce the gate leakage current and further improve the withstanding voltage. Further, the HEMT 300 with the above dielectric film can realize high reliability of the semiconductor device.

Forming procedure of the surface protection film 7, the voltage-resistant protection film 8, the moisture-resistant protection film 9, and the gate electrode G according to the third embodiment are explained below. Similar to the forming procedure explained with the HEMT 200, the source electrode S and the drain electrode D are firstly formed and the mask on the electron supply layer 4 is removed. The surface protection film 7 of the dielectric film of $SiN_x$ with the refractive index of, for example, 2.02, is deposited between the source electrode S and the drain electrode D on the electron supply layer 4. The voltage-resistant protection film 8 of the dielectric film of $SiO_2$ with a permittivity of 4.0 is deposited on the surface protection film 7. The moisture-resistant protection film 9 of the dielectric film of $SiN_x$ is further deposited on the voltage-resistant protection film 8. It is preferable that the thickness of the surface protection film 7 is smaller than or equal to 150 nm. The moisture-resistant protection film 9, the voltage-resistant protection film 8 and the surface protection film 7 formed on the surface, on which the gate electrode G is formed, are etched to form the opening portion corresponding to the gate electrode G. Lastly, Ni with a thickness of 100 nm and Au with a thickness of 200 nm are deposited on the opening portion to complete the formation of the gate electrode G.

According to the first to the third embodiments, the HEMT, a sort of the FET, is explained as an example of the semiconductor device according to the present invention. However, the present invention is not limited to the HEMT and can be applied to other type of FET such as metal insulator semiconductor FET (MISFET), metal oxide semiconductor FET (MOSFET), or metal semiconductor FET (MESFET).

Further, the present invention can also be applied to various diodes such as Schottky diode alternative to the FET. For example, a diode can be realized with a structure, in which a cathode electrode and an anode electrode are formed alternative to the source electrode S, the drain electrode D, and the gate electrode G used in the HEMTs 100 to 300 and the surface protection film 7 is formed between the cathode electrode and the anode electrode on the surface of the compound semiconductor layer. Further, another diode can be realized with the structure, in which at least either the voltage-resistant protection film 8 or the moisture-resistant protection film 9 is formed on the surface protection film 7.

According to the first to the third embodiments, the semiconductor device having a compound semiconductor layer of a nitride-based compound semiconductor, especially of a GaN-based compound semiconductor is explained. However, the present invention is not limited to the nitride or GaN-based compound semiconductor device and can be applied to any compound semiconductor device.

According to an embodiment of the present invention, an occurrence of the current collapse can be prevented, the leakage current such as the gate leakage current or the Schottky leakage current can be reduced, and the withstanding voltage can be improved, thereby realizing high reliability in the semiconductor device.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device comprising:
   a plurality of electrodes including a first electrode and a second electrode arranged on a nitride-based compound semiconductor layer grown on a substrate; and
   a surface protection film that covers a surface of a semiconductor layer on the compound semiconductor layer between the electrodes by extending in direct contact with all the surface of the semiconductor layer from the first electrode to the second electrode of the plurality of electrodes, wherein
   the surface protection film is a dielectric film of silicon nitride expressed by formula $SiN_x$, and
   a value of $_x$, which is a composition ratio of silicon and nitrogen, is determined to be in a range by which a refractive index of the surface protection film along all of the surface of the semiconductor layer from the first electrode to the second electrode is equal to or greater than 2.0 and equal to or less than 2.09 in order to minimize leakage current.

2. The semiconductor device according to claim 1, wherein the refractive index of the surface protection film is determined based on the composition ratio of silicon and nitride.

3. The semiconductor device according to claim 1, further comprising:
   a voltage-resistant protection film that is formed on the surface protection film, wherein
   the voltage-resistant protection film is a dielectric film having a predetermined voltage resistance.

4. The semiconductor device according to claim 3, further comprising:
   a moisture-resistant protection film that is formed on the voltage-resistant protection film, wherein
   the moisture-resistant protection film is a dielectric film having a predetermined moisture resistance.

5. The semiconductor device according to claim 1, wherein the semiconductor device is either one of a diode and a field effect transistor.

6. The semiconductor device according to claim 1, wherein the compound semiconductor includes an electron supply layer of AlGaN and a channel layer of GaN, and the surface protection film is disposed on the electron supply layer.

7. The semiconductor device according to claim 1, wherein said surface protection film begins at a side surface of the first electrode and ends at a side surface of the second electrode and is not on top of the electrodes.

* * * * *